(12) United States Patent
Uchida et al.

(10) Patent No.: US 8,410,620 B2
(45) Date of Patent: Apr. 2, 2013

(54) PRIMER RESIN FOR SEMICONDUCTOR DEVICE AND SEMICONDUCTOR DEVICE

(75) Inventors: Makoto Uchida, Tokyo (JP); Shigeru Moteki, Tokyo (JP); Ryutaro Tanaka, Tokyo (JP); Hiromi Morita, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 267 days.

(21) Appl. No.: 12/733,635

(22) PCT Filed: Sep. 18, 2008

(86) PCT No.: PCT/JP2008/002568
§ 371 (c)(1),
(2), (4) Date: Mar. 11, 2010

(87) PCT Pub. No.: WO2009/037834
PCT Pub. Date: Mar. 26, 2009

(65) Prior Publication Data
US 2010/0207282 A1 Aug. 19, 2010

(30) Foreign Application Priority Data
Sep. 20, 2007 (JP) ................. 2007-243368

(51) Int. Cl.
H01L 23/29 (2006.01)
(52) U.S. Cl. ....................... 257/790; 257/787
(58) Field of Classification Search .......... 257/787, 257/790, 792
See application file for complete search history.

(56) References Cited

U.S. PATENT DOCUMENTS

| 4,586,997 | A | * | 5/1986 | Lee | 525/426 |
| 4,629,777 | A | | 12/1986 | Pfeifer | |
| 4,937,133 | A | | 6/1990 | Watanabe et al. | |
| 5,037,691 | A | | 8/1991 | Medney et al. | |
| 5,059,677 | A | * | 10/1991 | Kohtoh et al. | 528/353 |
| 5,268,447 | A | | 12/1993 | Tamai et al. | |
| 5,677,393 | A | | 10/1997 | Ohmori et al. | |
| 5,955,779 | A | * | 9/1999 | Matsuura et al. | 257/678 |
| 5,958,653 | A | * | 9/1999 | Matsuura et al. | 430/313 |
| 6,340,518 | B1 | | 1/2002 | Kitahara et al. | |
| 6,429,372 | B1 | * | 8/2002 | Taguchi et al. | 174/535 |
| 7,115,681 | B2 | | 10/2006 | Shimo-Ohsako et al. | |
| 7,427,811 | B2 | * | 9/2008 | Derderian et al. | 257/783 |
| 8,062,933 | B2 | * | 11/2011 | Huang et al. | 438/122 |
| 8,080,319 | B2 | | 12/2011 | Tanaka et al. | |
| 2002/0056561 | A1 | * | 5/2002 | Yaguchi et al. | 174/52.1 |
| 2003/0040578 | A1 | | 2/2003 | Sugo et al. | |
| 2004/0019174 | A1 | | 1/2004 | Ichiroku et al. | |
| 2004/0105990 | A1 | * | 6/2004 | Shiobara et al. | 428/473.5 |
| 2004/0171191 | A1 | * | 9/2004 | Connell et al. | 438/112 |
| 2006/0054589 | A1 | | 3/2006 | Omori et al. | |
| 2007/0093614 | A1 | * | 4/2007 | Uchida et al. | 525/396 |
| 2007/0120271 | A1 | * | 5/2007 | Kozakai et al. | 257/779 |
| 2009/0123747 | A1 | * | 5/2009 | Fujimaru et al. | 428/355 EP |
| 2009/0286087 | A1 | | 11/2009 | Tanaka et al. | |
| 2010/0233476 | A1 | | 9/2010 | Uchida et al. | |
| 2011/0084411 | A1 | * | 4/2011 | Eu et al. | 257/792 |

FOREIGN PATENT DOCUMENTS

| JP | 2-180980 A | 7/1990 |
| JP | 4-345682 A | 12/1992 |
| JP | 4-366194 A | 12/1992 |
| JP | 5-22399 B2 | 3/1993 |
| JP | 10-733 A | 1/1998 |
| JP | 10-81748 A | 3/1998 |
| JP | 2000-183239 A | 6/2000 |
| JP | 3221756 B2 | 8/2001 |
| JP | 2002-3715 A | 1/2002 |
| JP | 2002-289196 A | 10/2002 |
| JP | 2003-118054 A | 4/2003 |
| JP | 2003-306649 A | 10/2003 |
| JP | 2004-35650 A | 2/2004 |
| JP | 2004-51794 A | 2/2004 |
| JP | 2004-91734 A | 3/2004 |
| JP | 2005-82628 A | 3/2005 |
| JP | 2005-290327 A | 10/2005 |
| JP | 2005-330401 A | 12/2005 |
| JP | 2006-82228 A | 3/2006 |
| WO | 03/006553 A1 | 1/2003 |
| WO | 2007/046405 A1 | 4/2007 |
| WO | 2007/148666 A1 | 12/2007 |

OTHER PUBLICATIONS

Office Action dated Jun. 23, 2011 in co-pending U.S. App. No. 12/308,308.
Office Action dated Jul. 26 2011 in co-pending U.S. App. No. 12/083,588.
Chinese communication dated Jul. 30, 2010 in a co-pending foreign application (CN200780019440.x).
International Search Report dated Oct. 28, 2008 in corresponding foreign application (PCT/JP2008/002568).
International Search Report dated Oct. 2, 2007 in co-pending foreign application (PCT/JP2007/062266).
International Search Report dated Dec. 26, 2006 in co-pending foreign application (PCT/JP2006/320724).
Notice of Allowance mailed Sep. 27, 2011 in co-pending U.S. Appl. No. 12/083,588.

\* cited by examiner

*Primary Examiner* — James Mitchell
(74) *Attorney, Agent, or Firm* — Nields, Lemack & Frame, LLC

(57) ABSTRACT

The present invention relates to a primer resin for semiconductor devices which comprises a polyamide resin represented by the following formula (1):

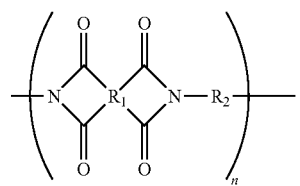

(wherein, $R_1$ represents a tetravalent aromatic tetracarboxylic acid residue selected from the group consisting of pyromellitic acid, 3,4,3',4'-diphenyl ether tetracarboxylic acid, 2,3,6,7-naphthalenetetracarboxylic acid and 3,4,3',4'-benzophenone tetracarboxylic acid, $R_2$ represents at least one kind of divalent diamine residue selected from the group consisting of diamino-4,4'-hydroxydiphenylsulfone, 4,4'-diamino-3,3'5,5'-tetraethyldiphenylmethane and 1,3-bis-(aminophenoxy)benzene, and n is a repeating number and represents a positive number of 10 to 1000) and has a lead frame comprising copper or 42 alloy, a semiconductor device having said primer resin layer between a lead frame comprising copper or 42 alloy and a cured product of a sealing resin, and a semiconductor sealing epoxy resin composition containing said primer resin; and said semiconductor device has an extremely improved adhesiveness between said lead frame and a cured product of a sealing resin composition and also is excellent in heat resistance and low moisture absorption.

8 Claims, 4 Drawing Sheets

PRIMER RESIN FOR SEMICONDUCTOR DEVICE AND SEMICONDUCTOR DEVICE

TECHNICAL FIELD

The present invention relates to a cured product of a semiconductor sealing resin composition, a primer resin for semiconductor devices providing adhesiveness with a lead frame comprising copper or 42 alloy and/or a semiconductor element, a sealing resin composition containing said primer resin, a semiconductor device using said primer resin and a method for producing the same.

BACKGROUND ART

Usually, the semiconductor sealing resin composition is required to be excellent in heat resistance, moisture resistance, electrical properties, adhesiveness and the like, and therefore it is generally an epoxy resin composition comprising an epoxy resin, a phenol-based curing agent, a curing accelerator and an inorganic filler. In addition, the semiconductor device has come to have a higher density, a less thickness and an increased number of pins with the advance of fine processing technology.

When such a semiconductor device, particularly a thin semiconductor device is produced, poor mold-releasing property of a sealing resin (for example, a cured product of an epoxy resin composition) from a mold in releasing a semiconductor device after seal-molding leads to generation of stress, resulting in problems such as cracking in the semiconductor element itself inside the semiconductor device or/and deterioration of adhesion properties in the interface between the cured product and the semiconductor element. In addition, in surface mounting of a semiconductor device, the semiconductor device is exposed to a high temperature of 200° C. or more during the solder reflow process with the use of a lead-free solder, resulting in detachment of the sealing resin composition from IC tips and the lead frame and in cracking of the package, and thus defects extremely reducing reliability have been generated.

Lately in addition, there have been more opportunities where a copper lead frame is used due to need of heat radiation property and copper oxidation causes deterioration of adhesion properties between a lead frame and a sealing resin composition, whereby much better adhesion properties have been required.

As a resin composition to meet such requirements, a sealing resin composition using a novel epoxy (Patent Literature 1), a sealing resin composition containing an amide compound (Patent Literature 2), a sealing resin composition containing a trace amount of triazole compound (Patent Literature 3), and the like are known. In the case that these are used, adhesiveness between a cured product of said sealing resin compositions and a lead frame and/or semiconductor element shortly after molding is excellent, but durabilities such as heat resistance, moisture resistance, electrical properties and the like are not enough because adhesive strength is reduced over time due to reduction of water absorption resistance and heat resistance of said cured product and further due to over time reduction of adhesive strength with oxidation of lead frame. In addition, a primer resin composition for semiconductor devices which contains an alkoxysilyl group-containing polyamide-imide resin such as Patent Literature 4 has been proposed.

Patent Literature 1: JP 2003-246836 A
Patent Literature 2: JP H10-324794 A
Patent Literature 3: JP 2006-335829 A
Patent Literature 4: JP 2006-241414 A

DISCLOSURE OF THE INVENTION

Problems to be Solved by the Invention

As described above, a semiconductor device excellent in long-term adhesion properties between a cured product of a sealing resin composition and metallic members, particularly copper and 42 alloy, and also excellent in heat resistance and low moisture absorption is required, and the present invention provides a semiconductor device to meet the above requirements by using a certain primer resin for semiconductor devices or/and a sealing resin composition containing said primer resin.

Means of Solving the Problems

The present inventors have intensively studied to solve the above problems and completed the present invention. That is, the present invention relates to:

(1) A primer resin for semiconductor devices which is a primer resin to provide adhesiveness of a cured product between a semiconductor sealing resin composition and either or both of a lead frame comprising copper or 42 alloy and a semiconductor element; and which is characterized by having a ring-closed polyimide structure represented by the following formula (1):

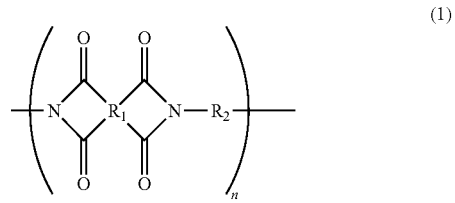

(wherein, n is a repeating number and represents a positive number of 10 to 1000, $R_1$ represents at least one kind of quadrivalent aromatic group selected from the group consisting of the following formula (2):

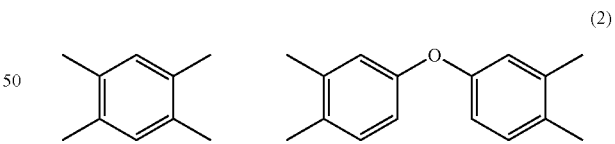

and $R_2$ represents at least one kind of divalent aromatic group selected from the group consisting of the following formula (3):

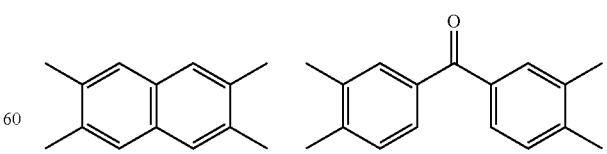

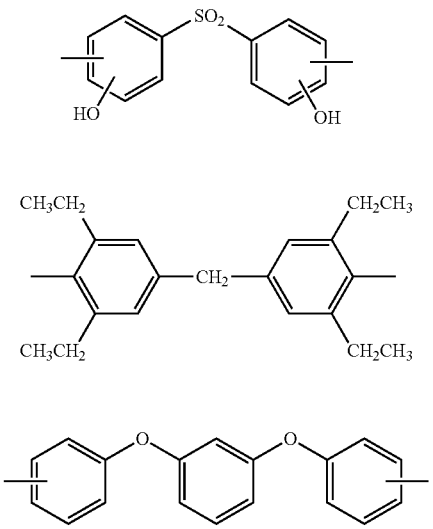

respectively), (2) A semiconductor device characterized by containing a resin layer formed from the primer resin according to the above (1) between a cured product of a semiconductor sealing resin composition and either or both of a lead frame comprising copper or 42 alloy and a semiconductor element, (3) An semiconductor sealing epoxy resin composition characterized in that the primer resin (A) according to the above (1), an epoxy resin (B), a curing agent (C) and an inorganic filler (D) are essential components, (4) A method for producing a semiconductor device characterized by applying a primer resin having a ring-closed polyimide structure represented by the following formula (1):

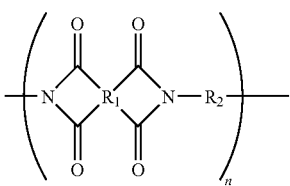

(wherein, n is a repeating number and represents a positive number of 10 to 1000, $R_1$ represents at least one kind of quadrivalent aromatic group selected from the group consisting of the following formula (2):

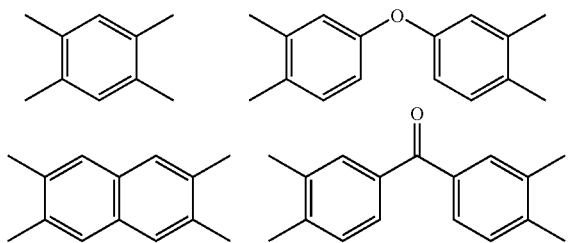

and $R_2$ represents at least one kind of divalent aromatic group selected from the group consisting of the following formula (3):

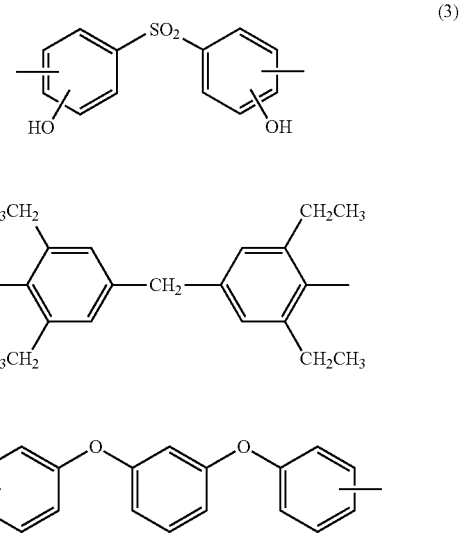

respectively)

on a lead frame provided with a semiconductor element to form said primer resin layer and then by sealing the semiconductor element with a cured product of a semiconductor sealing resin composition, (5) The semiconductor device according to the above (2), wherein $R_1$ is at least either one of the groups depicted by the following formula (2-1):

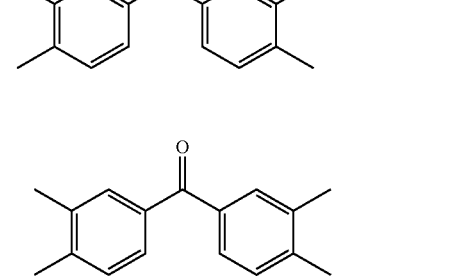

(6) The semiconductor sealing epoxy resin composition according to the above (3), wherein $R_1$ is at least either one of the groups of the formula (2-1) according to the above (5), (7) The method for producing a semiconductor device according to the above (4), wherein $R_1$ is at least either one of the groups of the formula (2-1) according to the above (5), (8) The semiconductor device according to the above (2), wherein the ring-closed polyimide structure is a ring-closed polyimide structure represented by any one of the following formulas (7') to (9'):

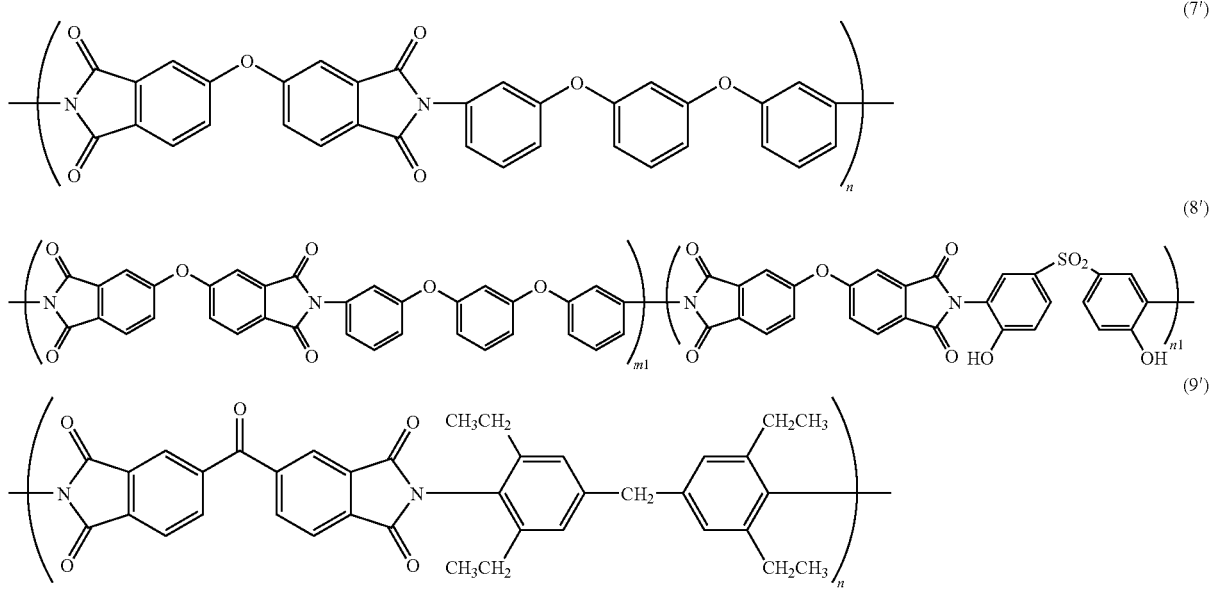

(wherein, n represents a positive number of 10 to 1000 and each of n1 and m1 represents a positive number of 1 to 1000, provided that n1+m1 is a positive number of 10 to 1000), (9) The method for producing a semiconductor device according to the above (4), the ring-closed polyimide structure is at least any one of the groups of the formulas (7') to (9') according to the above (8),

(10) Use of a resin having a ring-closed polyimide structure represented by the following formula (1):

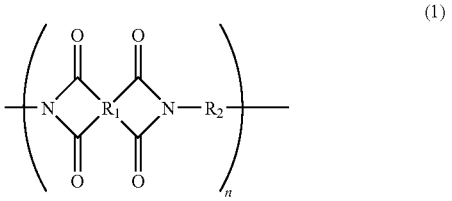

(wherein, n is a repeating number and represents a positive number of 10 to 1000, R1 represents one or more kinds of quadrivalent aromatic groups selected from the following formula (2):

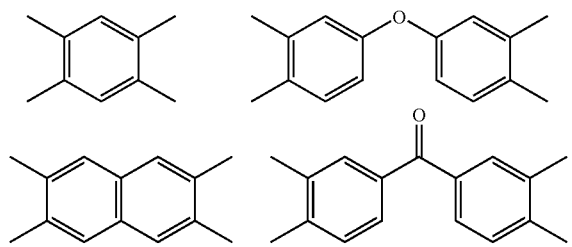

and R2 represents at least one kind of divalent aromatic group selected from the group consisting of the groups depicted by the following formula (3):

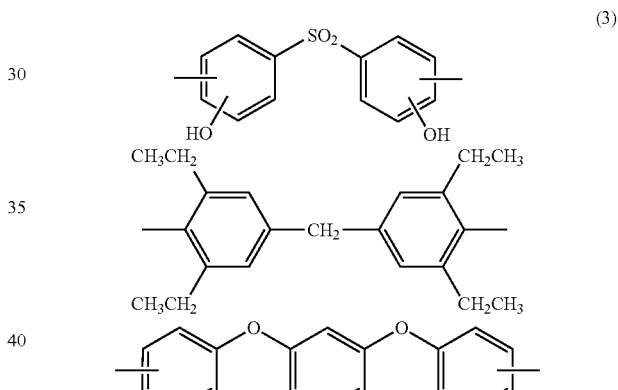

respectively)

as a primer resin for semiconductor devices, in order to produce a semiconductor device having a primer resin layer to provide adhesiveness between a cured product of a semiconductor sealing resin composition and either or both of a lead frame comprising copper or 42 alloy and a semiconductor element.

Effect of the Invention

The primer resin for semiconductor devices of the present invention is a ring-closed polyimide which has been already imidized, whereby it is excellent in heat resistance, has almost no curing shrinkage and thus is flexible, has less shrinkage stress when coated on a lead frame comprising copper or 42 alloy and/or on a semiconductor element, extremely improves adhesive strength between a cured product of a semiconductor sealing resin composition (herein also referred to as cured product of sealing resin) and said lead frame and/or a semiconductor element, and maintains adhesive strength over a long period of time, and in addition, it is excellent in heat resistance, enhance solder cracking resistance and further has an excellent moisture absorption resistance. Furthermore, it has a rust preventive effect to protect a copper lead frame from corrosion.

Further, when the primer resin of the present invention is mixed with a sealing resin composition, heat resistance of a cured product of a sealing resin is improved and in addition, adhesive strength to a lead frame and/or a semiconductor element and durability are also improved. Therefore, the semiconductor device using the primer resin for semiconductor devices of the present invention (hereinafter also referred to as primer resin of the present invention) has an improved long-term reliability.

DESCRIPTION OF SYMBOLS

Figure 1:
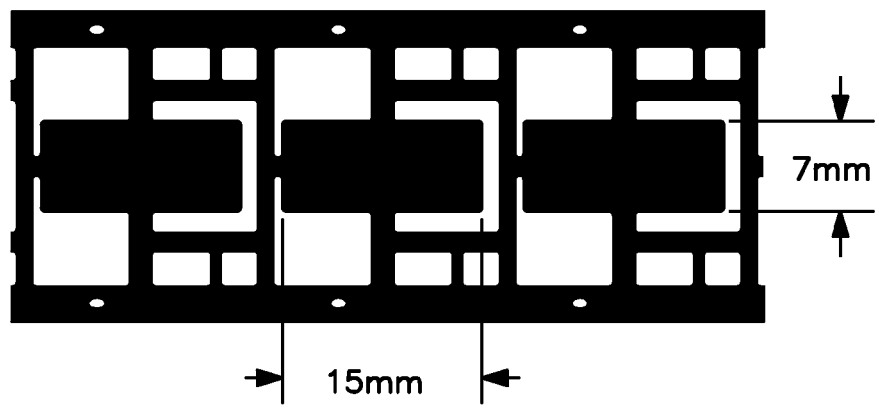
FIG. 1 shows a lead frame for adhesive evaluation.

1: Drawing-out section for adhesive evaluation
2: Cut section
3: Semiconductor sealing resin composition
4: Locking section
5: A lead frame comprising copper or 42 alloy
6: A semiconductor
7: A resin layer comprising a primer resin

BEST MODE FOR CARRYING OUT THE INVENTION

The primer resin for semiconductor devices of the present invention is not particularly limited and as long as it is a polyimide resin having a ring-closed imide segment containing the structure represented by the following formula (4):

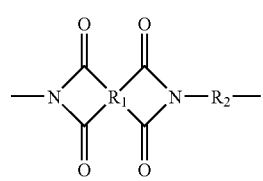

(4)

(wherein, $R_1$ and $R_2$ have the same meanings as in the above formula (1))
as a repeating unit, and the repeating number of this segment is preferably 10 to 1000. If the repeating number is less than 10, it is difficult to exhibit heat resistance and mechanical strength which polyimide has in itself, and in addition, the copper foil surface is more likely to be affected by the terminal group (amino group or carboxy group) of the polyimide resin. Meanwhile, if it is more than 1000, viscosity in solution is high whereby it is difficult to form a layer and also adhesiveness with a copper foil surface is reduced. Taking these problems into consideration, the above repeating number is preferably 50 to 500. Further, the weight average molecular weight of a polyimide resin is preferably about 5,000 to 500,000 in terms of workability. The primer resin of the present invention is preferably a polyimide resin composed by only repeating the above segment.

In the case that a conventional polyimide resin is processed into a resin layer, a varnish containing its precursor (polyamic acid) is usually coated on a substrate and dried, and then the precursor is subjected to ring closure reaction by heat treatment to give a polyimide resin layer. On the other hand, in the case of the primer resin of the present invention, a polyimide resin layer can be obtained only by directly coating a solution dissolving the primer resin of the present invention (polyimide resin) on a substrate and then by drying. Further, it can be directly mixed with a resin composition which is a sealing material, as described later.

The primer resin for semiconductor devices of the present invention can be obtained by that polyamic acid is obtained by condensation reaction of at least one kind selected from the group consisting of the tetracarboxylic acid dianhydrides usually represented by the following formula (5):

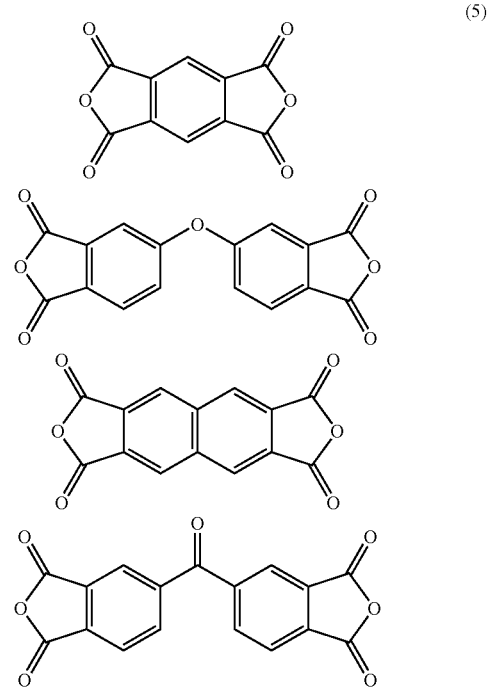

(5)

preferably, either or both of 3,4,3',4'-diphenylethertetracarboxylic acid dianhydride or 3,4,3',4'-benzophenontetracarboxylic acid dianhydride, with at least one kind selected from the group consisting of diamines represented by the following formula (6):

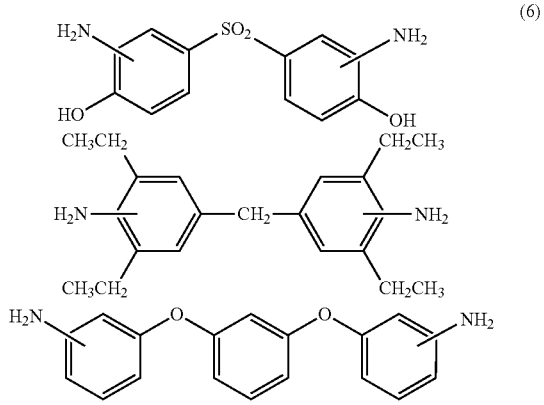

preferably, of diamines represented by the following formula (6'):

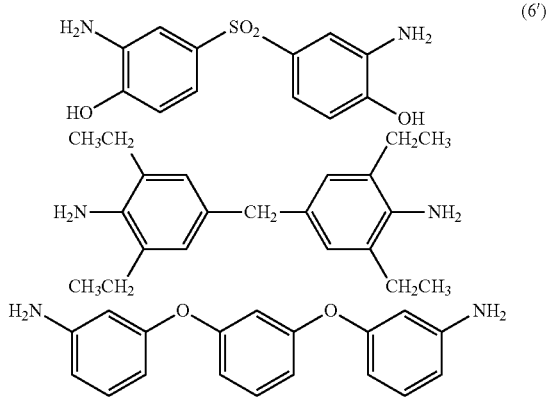

and then it is subjected to ring closure.

The obtained polyimide resin is a resin having a polyimide structure represented by the formula (1), preferably a polyimide resin (polyimide resin of the formula (1) wherein $R_2$ is a diamine residue represented by the above formula (6')) obtained by condensation at least one kind of diamine selected from the group consisting of the formula (6') with at least one kind of tetracarboxylic acid dianhydride selected from the group consisting of the formula (5) and then by ring closure, and more preferably a polyimide resin (polyimide resin of the formula (1) wherein $R_1$ is a tetravalent tetracarboxylic acid residue selected from either or both of the above two kinds of tetracarboxylic acids and $R_2$ is a divalent diamine residue represented by the above formula (6')) obtained by condensation at least one kind of diamine selected from the group consisting of the formula (6') with at least one kind of tetracarboxylic acid dianhydride selected from the group consisting of 3,4,3',4'-diphenylethertetracarboxylic acid dianhydride and 3,4,3',4'-benzophenontetracarboxylic acid dianhydride and then by ring closure. The most preferable is a polyimide resin of the structure represented by the above formulas (7') to (9'). In these polyimides, it is more preferable that the both terminals thereof are acid anhydride groups.

The ring closure reaction of polyamic acid can be carried out in a polar solvent containing at least one kind selected from the group consisting of N-methyl-2-pyrrolidone, N,N-dimethylacetoamide, methylbenzoate, valerolactone or butyrolactone, preferably in a lactam solvent such as N-methyl-2-pyrrolidone or a cyclic ketone solvent such as valerolactone or butyrolactone {more preferably a solvent of a hetero 5 membered ring carbonyl compound containing an N atom or an O atom (which may have a C1 to C3 alkyl substitution)} and preferably a mixed solvent where a small amount of a nonpolar solvent having a relatively low boiling point is added to said polar solvent. More details will be described afterward. The thus-obtained polyimide resin solution is usually a polar solvent solution not containing a nonpolar solvent (and if a nonpolar solvent is contained, it is preferable to remove it off after completion of reaction), and said polyimide solution can be used for coating on a lead frame and/or a semiconductor element as well as an usual varnish.

Usually, the polyimide resin solution obtained by the above synthesis can be used as it is, as a coating solution, but it is diluted with a polar solvent, preferably the above ketone solvent, to a concentration suitable for usual coating to give a coating solution. In addition, the polyimide resin obtained in the above synthesis example may be isolated and then dissolved in the above polar solvent, preferably the above ketone solvent to give a coating solution.

In addition, it is also possible that said polyimide resin solution is added to a semiconductor sealing epoxy resin composition to give a semiconductor sealing epoxy resin composition in the present invention.

The concentration of the polyimide resin (primer resin) in this coating solution (hereinafter also referred to as a primer resin solution) is usually 1 to 50% by weight, preferably 3 to 30% by weight and more preferably about 5 to 30% by weight, and this concentration is easy to handle.

The ring closure reaction by heating of the above polyamic acid in the present invention can be carried out only in the above polar solvent, but it is preferably carried out in a mixed solvent where a small amount of a nonpolar solvent having a relatively low boiling point (of about 50 to 150° C.) such as toluene, xylene, hexane, cyclohexane and heptane and a small amount of an imidization catalyst such as pyridine and pyridine derivatives are added, while removing water by-produced during the reaction out of the reaction system by means of azeotropy or the like. The reaction temperature is preferably 150 to 220° C. and particularly preferably 180 to 200° C. The reaction time is preferably 2 to 10 hours and particularly preferably 5 to 8 hours. The addition amount of the nonpolar solvent is preferably 5 to 20% by weight in the whole solvent, and the addition amount of the imidization catalyst is preferably 0.5 to 5% by weight in the whole solvent.

The repeating number in the primer resin of the present invention can be controlled by the molar ratio of tetracarboxylic acid dianhydride component and diamine component, and the average repeating number is 100 (theoretical value) by such reaction that, for example, tetracarboxylic acid dianhydride component:diamine component=1.00 mol:1.01 mol or 1.01 mol:1.00 mol. The terminal is amine when the diamine component is excess, and the terminal is acid anhydride when the tetracarboxylic acid dianhydride component is exceed. In addition, when the repeating number of the above segment is in the above range, the influence of the terminal group of the polyimide resin is small but usually it is more preferred that the both terminals are acid anhydride groups.

According to necessity, various additives can be added to the primer resin solution of the present invention. The additives and the addition amounts thereof are preferably within the range not impairing the effects of the primer resin layer obtained by drying said resin solution (improvement of adhesive strength of a lead frame and/or a semiconductor element with a cured product of a semiconductor sealing resin, rust preventive effect of metallic materials such as copper or 42 alloy of lead frames, and the like). The additives include, for example, an organic additive such as aromatic polyamide resin or an inorganic additive such as silica compound, a pigment, a dye, a surfactant, a leveling agent, a plasticizer, a flame retarder, an antioxidant, an antistatic agent, a viscosity modifier, an imidization catalyst, a dehydrating agent, a light stabilizer, a low dielectric material, a conductive material, a magnetic material, a heat decomposable compound, or the like. When these additives are added to a primer resin solution of the present invention, the primer resin layer in the present invention which is formed from it also contains them, and the primer resin layer of the formula (1) containing such additives is also included in the resin layer formed from the primer resin of the formula (1) in the present invention (the primer resin layer of the formula (1) or the primer resin layer of the present invention) as long as the effects of the present invention are achieved. The amount of the additives relative to the primer resin of the present invention is preferably within 0 to 100% by weight, more preferably 0 to 30% by weight and further preferably within about 0 to 10% by weight. Usually, it is preferred to form a primer resin layer of the above formula (1) from said resin solution not containing those additives, and preferable is a primer resin layer of the above formula (1) not containing the above additives.

In order to form the primer resin layer of the present invention, the above primer resin solution may be coated on the above lead frame and/or semiconductor element followed by drying, so that the thickness calculated as a primer resin layer (thickness after removing a solvent off and drying) is 0.1 to 15 μm and preferably 0.1 to 10 μm. For example, by coating a resin solution of the primer resin having a concentration of 20% by weight at a thickness of 5 μm and by drying at 80 to 200° C. for 5 to 60 minutes and preferably at 130 to 150° C. for 10 to 30 minutes, a primer resin layer having a thickness of around 1 μm is obtained.

The heat source of drying may be hot air or a far infrared heater, but it is recommended to use hot air and a far infrared heater in combination in terms of prevention of solvent vapor retention and heat conduction to the inside of the resin.

The semiconductor device provided with a resin layer containing the primer resin of the present invention is not particularly limited as long as it is a semiconductor device having the above primer resin layer between a cured product for a semiconductor sealing resin and a lead frame as a metallic material and/or a semiconductor element.

The above semiconductor sealing resin composition to be used in the present invention may be any resin composition as long as it can be used for sealing a usual semiconductor element, but preferable is an epoxy resin composition. As an epoxy resin composition for sealing a semiconductor element, an epoxy resin composition containing an epoxy resin, a curing agent and an inorganic filler is usually used. The composition ratios of these are in the range in which they are usually used. For example, the epoxy resin is 1 to 25% by weight relative to the whole amount of a sealing epoxy resin composition and preferably about 3 to 15% (in the present invention, % means "% by weight" unless otherwise noted). With respect to the content of curing agent, the molar ratio of the active hydrogen atom contained in the curing agent is in the range of 0.5 to 2 and preferably 0.7 to 1.5 relative to 1 mol of the epoxy group contained in the epoxy resin. The rest is an inorganic filler and, for example, 50 to 98%, preferably 70 to 95% and further preferably about 80 to 93%, relative to the whole sealing epoxy resin composition. In addition, according to necessity, various additives to be usually added to a sealing composition may be contained.

The above epoxy resin may be any epoxy resin as long as it can be usually used for sealing a semiconductor, and a compound having at least two epoxy groups in 1 molecule is used.

In addition, as the above curing agent, any can be used as long as it is used as a curing agent for the above epoxy resin. Usually, phenolic hydroxy group-containing compound is used.

Further, as the above inorganic filler, any inorganic filler can be used as long as it is usually used for a semiconductor sealing resin composition.

Specific examples of the above epoxy resin, the above curing agent, the above inorganic filler, the above other additives and the like can include additives described in the section for explanation about the epoxy resin (B), the curing agent (C), the inorganic filler (D) and the various additives except for the essential components in explanation about the semiconductor sealing resin composition of the present invention described afterward. Furthermore, preferable and more preferable ones are the same as in the case of the semiconductor sealing resin composition of the present invention. For example, the preferable epoxy resin can include a phenolic novolak epoxy resins which may have a C1 to C4 alkyl substitution or/and dicyclopentadiene skeleton-containing epoxy resins, and the preferable curing agent can include phenolic hydroxy group-containing novolak resins. In addition, the other additive which is preferably added to the above semiconductor sealing resin composition can include an epoxy resin curing accelerator. Further, another additive which is preferably added thereto can optionally include a silane coupling agent together with said curing accelerator, and it is preferably used in combination with said curing accelerator. In the sealing resin composition comprising an epoxy resin, a curing agent and an inorganic filler as essential component usually used in the above semiconductor sealing, the content ratio of said essential 3 components is, for example, 90 to 100% by weight, preferably 95 to 100% by weight and further preferably 98 to 100% by weight relative to the whole amount of the sealing resin composition. The other additive content is the rest.

In addition, optionally, as the above sealing resin composition, a semiconductor sealing resin composition of the present invention containing a primer resin of the present invention as described later may be also used. Said semiconductor sealing resin composition of the present invention is usually used without a primer resin layer because improvement of adhesive strength between a lead frame and/or a semiconductor element and a sealing material layer and rust preventive effect of metals (specifically, copper, 42 metallic alloy and the like) are exhibited even without providing a primer resin layer.

The lead frame in the semiconductor device of the present invention is a lead frame comprising copper or 42 alloy as a material, and may be a lead frame where one or more kinds of plated layers selected from nickel, palladium, gold, silver, iron, zinc, aluminum and tin and/or a silane coupling agent layer are provided on the present lead frame surface. In this regard, 42 alloy is an alloy of iron and nickel and the rate of nickel is 42%.

The plated layer on a lead frame surface is obtained by electrolytic plating or non-electrolytic plating with a metal as included above, preferably at least one kind of metal selected from the group consisting of nickel, iron, zinc, aluminum, gold, silver, tin and palladium, and the thickness thereof is preferably 1 to 100 nm.

In addition, in the above silane coupling agent, a silane coupling agent where an organic group and a hydrolyzable group are directly bonded to a silicon atom is used, for example, epoxysilane, aminosilane, mercaptosilane, ureidesilane and the like. Among them, a silane coupling agent having an amino group is preferably used. Specific examples of the particularly preferable silane coupling agent having an amino group include gamma-aminopropyltrimethoxysilane, gamma-aminopropyltriethoxysilane, N-phenyl-gamma-aminopropyltrimethoxysilane, N-phenyl-gamma-aminopropylmethyldimethoxysilane, N-beta(aminoethyl)gamma-aminopropyltrimethoxysilane, N-beta(aminoethyl)gamma-aminopropylmethyldimethoxysilane and the like. Further, the thickness of the coupling agent layer is preferably 1 to 50 nm.

The semiconductor device having the primer resin layer of the present invention can be produced as follows, for example.

That is, it can be obtained in that said primer resin layer is formed by applying the primer resin of the present invention to the above lead frame provided with a semiconductor element, preferably a lead frame comprising unplated copper or 42 alloy, where is provided with a semiconductor element, or a lead frame comprising plated copper or 42 alloy, where is provided with a semiconductor element, and then resin sealing is performed. According to necessity, it is also possible that before applying the primer resin of the present invention, a silane coupling layer or another protective layer is formed on the above lead frame, and then the primer resin of the present invention is applied. However, the primer resin layer of the present invention plays a role as a protective layer for a semiconductor, so it is usually preferred to form the primer resin layer of the present invention directly on the above lead frame. Therefore, the preferable semiconductor device in the present invention can include a semiconductor device having the primer resin layer of the present invention directly on a lead frame made of plated or unplated copper or 42 alloy which is provided with a semiconductor element whereon resin sealing is performed.

The method for applying the primer resin layer of the present invention on the above lead frame may be any method as long as it can form the primer resin layer of the present invention having a desired thickness. Usually, preferable is a method where a solution containing the primer resin of the present invention, for example, a polar solvent solution obtained by ring closure reaction of the above polyamic acid or a diluent thereof, or a polyimide solution dissolving, in the above polar solvent, a polyimide resin isolated after ring closure reaction is coated on the above lead frame by an ordinary method and dried to form the primer resin layer of the present invention. The concentration of the primer resin of the present invention in a coating solution is not particularly limited provided that coating can be performed, but usually about 2 to 40% preferably about 3 to 30%, more preferably about 5 to 30% and further preferably about 3 to 25%. After forming the primer resin layer of the present invention, resin sealing may be performed by an ordinary method, and for example, a semiconductor device having a primer resin layer of the present invention can be obtained by molding a semiconductor sealing resin composition, preferably the above semiconductor sealing epoxy resin composition.

The semiconductor sealing resin composition of the present invention contains the primer resin (A) of the present invention, the epoxy resin (B), a curing agent (C) and an inorganic filler (D). The semiconductor sealing resin composition of the present invention contains the primer resin of the present invention in an amount of usually 0.1 to 10% by weight, preferably 0.5 to 5% by weight and further preferably 1 to 3% by weight relative to the whole amount of said sealing resin composition. If the content of the primer resin is less than 0.1% by weight, adhesiveness to metallic materials is not enough, and if it is more than 10% by weight, mold-releasing property in molding is reduced and moisture resistance as a sealing resin composition is also reduced, resulting in reduction of long-term reliability.

The epoxy resin (B) in the semiconductor sealing resin composition of the present invention is not particularly limited and can be any compound as long as it has two or more epoxy groups in 1 molecule. For example, preferable one includes cresol novolak-type epoxy resins, phenol novolak-type epoxy resins, dicyclopentadiene skeleton-containing epoxy resins and the like. Commercially available products thereof include NC-3000 (manufactured by Nippon Kayaku Co., Ltd.) as a cresol novolak-type epoxy resin, EPPN-501 (manufactured by Nippon Kayaku Co., Ltd.) as a phenol novolak-type epoxy resin, XD-1000 (manufactured by Nippon Kayaku Co., Ltd.) as a dicyclopentadiene skeleton-containing epoxy resin, and the like. In the present invention, these may be used alone or in combination of two or more kinds.

The mixing amount of the epoxy resin (B) is usually 1 to 25% by weight, preferably 3 to 15% by weight and further preferably 5 to 10% by weight relative to the whole amount of said sealing resin composition. If the mixing amount is less than 1% by weight, moldability is not enough, and if is more than 25% by weight, crack resistance during molding is reduced.

The curing agent (C) in the semiconductor sealing resin composition of the present invention is not particularly limited and can be any compound as long as it is usually known curing agent for epoxy resins, but a phenol compound (phenolic hydroxy group-containing compound) is preferable as it has a low water absorption rate when converted to a cured product, and specific examples thereof include novolak resins (phenolic hydroxy group-containing novolak resins) such as phenol novolak resins, cresol novolak resins and naphthol novolak resins; tris(hydroxyphenyl)methane, 1,1,2-tris(hydroxyphenyl)ethane, 1,1,3-tris(hydroxyphenyl)propane, a condensation compound of terpene and phenol, dicyclopentadiene skeleton-containing phenol resins, phenolic aralkyl resins, naphthol aralkyl resins, biphenyl skeleton-containing phenolic aralkyl resins, catechol, resorcin, hydro quinone, pyrogallol, phloroglucinol and the like. These may be used alone or in combination of two or more kinds. Among them, a phenolic hydroxy group-containing novolak resin is more preferable and a phenol novolak resin which may have C1 to C4 alkyl substitution is more preferable.

The mixing amount of the curing agent (C) is usually 1 to 25% by weight, preferably 3 to 15% by weight and further preferably 5 to 10% by weight relative to the whole amount of said sealing resin composition. In addition, with regard to the mixing ratio of the epoxy resin (B) and the curing agent (C), the chemical equivalent ratio of the active hydrogen atom in the curing agent (C) relative to the epoxy group in the epoxy resin (B) is preferably in the range of 0.5 to 2, particularly 0.7 to 1.5, in terms of mechanical properties and moisture resistance reliability.

The inorganic filler (D) in the semiconductor sealing resin composition of the present invention includes amorphous silica, crystalline silica, silicon nitride, calcium carbonate, magnesium carbonate, alumina, aluminum hydroxide, magnesia, magnesium hydroxide, oxidation magnesium aluminum, zirconia, zircon, clay, diamond, talc, mica, calcium silicate, oxidation titanium, oxidation antimony, asbestos, glass fiber and the like, and any spherical-, crushed-, fiber- or the like-shaped substance can be used.

The mixing amount of the inorganic filler (D) is the rest of the mixing amount of the above components, and for example, it is usually 50 to 98% by weight, preferably 70 to 95% by weight (optionally 70 to 94%) and further preferably 80 to 93% by weight (optionally 80 to 90%), in the semiconductor sealing resin composition. If the inorganic filler (D) is less than 50% by weight or more than 98% by weight, solder heat resistance and moldability are poor and it is not in practical use.

The semiconductor sealing resin composition of the present invention can contain various additives other than the essential components of (A) to (D). Examples thereof include a epoxy curing accelerator, an aromatic polyamide resin, a pigment, a dye, an antihalation agent, a fluorescent brightening agent, a surfactant, a leveling agent, a silane coupling agent, a release wax, a plasticizer, a flame retarder, an antioxidant, an antistatic agent, a viscosity modifier, an ion catcher, a light stabilizer, a photocatalyst, a low dielectric material, a conductive material, a magnetic material, a heat decomposable compound and the like. It is particularly preferred that an epoxy curing accelerator is added because it accelerates curing. The curing accelerator is not particularly limited as long as it accelerates reaction of an epoxy resin with a curing agent. Specific examples of the curing accelerator to be used include imidazoles such as 2-methylimidazole, 2-phenylimidazole, 2-phenyl-4-methylimidazole and 2-undecylimidazole and salts thereof, tertiary amine compounds such as triethylamine, benzyldimethylamine and alpha-methylbenzylamine, amidine compounds such as 1,8-diazabicyclo(5,4,0)undecene-7,1,5-diazabicyclo(4,3,0)nonene and 7-methyl-1,5,7-triazabicyclo(4,4,0)decene-5 and salts thereof, phosphorous compounds such as triphenylphosphine, tris(2,6-dimethoxyphenyl)phosphine, tris(4-alkylphenyl)phosphine and trialkylphosphine and salts thereof, storage-stable curing accelerators where these curing accelerators are microencapsulated with a methacrylic acid methyl-based resin or a styrene-based resin. These curing accelerators may be used in combination of two or more kinds, or in addition, may be also melt-mixed in advance with the curing agent (C) or the epoxy resin (B) and then added.

It is more preferred that the semiconductor sealing resin composition of the present invention contains a curing accelerator other than the essential components of (A) to (D). The mixing amount of the curing accelerator is about 0.1 to 1% by weight relative to the whole amount of said sealing resin composition. In addition, optionally it is further preferred that it contains a silane coupling agent.

Furthermore, with regard to the content ratios of the essential components of (A) to (D) and the other above additives in the semiconductor sealing resin composition of the present invention, it is preferred that the essential components of the above (A) to (D) is 90 to 100% by weight, preferably 95 to 100% by weight and further preferably 98 to 100% by weight relative to the whole amount of said resin composition, and the addition amount of the others is the rest.

The semiconductor sealing resin composition of the present invention can be obtained by homogeneously mixing the above components at the predetermined ratios. In addition, the mixing method is kneader, ruder, mixing roll or the like, while heating, according to necessity. In this regard, the primer resin may be added as it is, or a resin solution thereof may be added.

EXAMPLES

Hereinafter, the present invention will be more specifically explained with reference to the following synthesis examples and examples, but the present invention is not limited these synthesis examples and examples.

Synthesis Example 1

Into a 300 ml reactor equipped with a thermometer, a reflux cooler, a Dean-Stark trap, a powder inlet, a nitrogen inlet device and a stirring device, 24.84 g (0.085 mol) of APB-N (1,3-bis-(3-aminophenoxy)benzene manufactured by Mitsui Chemical, Inc., molecular weight: 292.34) as a diamine component was put, and 38.42 g of methylbenzoate as a solvent was added thereto while flowing dry nitrogen, followed by stirring at 60° C. for 30 minutes. After that, 26.88 g (0.087 mol) of ODPA (3,3'-oxydiphthalic acid anhydride: manufactured by MANAC Incorporated, molecular weight: 310.22) as tetracarboxylic acid dianhydride component, 57.63 g of gamma-butyrolactone and 0.868 of gamma-valerolactone as solvents, 1.371 g of pyridine as a catalyst and 22.2 g of toluene as a dehydrating agent were further added thereto. The inside of the reactor was heated to 180° C. and the temperature was maintained for 6 hours while distilling off generated water through the Dean-Stark trap to carry out synthesis of polyamic acid and ring closure reaction (imidization reaction). After completion of the imidization reaction, the resulting reaction liquid was cooled to 80° C. or less and then filtered under pressure using a Teflon (registered trademark) filter having a pore size of 3 μm. A 168 g solution (referred to as primer resin solution) was obtained where a polyimide resin represented by the following formula (7):

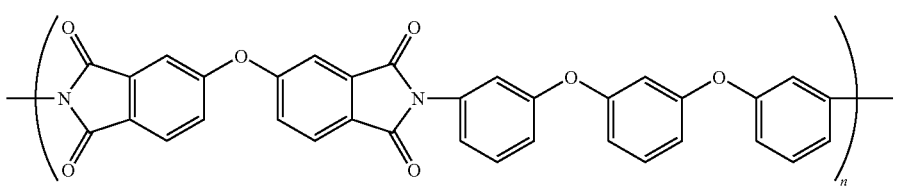

(7)

(wherein, n is a repeating number and the total weight average molecular weight is 96600)

was dissolved in a mixed solvent of gamma-butyrolactone and methylbenzoate at a concentration of 34% by weight. Using an E-type rotational viscometer, 1.00 ml of this primer resin solution was measured at 25° C., resulting in that the rotational viscosity was 26.8 Pa·s. In addition, 50 g out of this primer resin solution was added to 300 g of water. The precipitated resin was separated by filtration. For purification of said resin, 200 g of water was added to the separated resin and the mixture was refluxed. Then the resulting liquid was cooled to room temperature and then filtered, and the resulting resin was dried to obtain 16 g of resin powder (yield: 94.1%).

Synthesis Example 2

Into a 500 ml reactor equipped with a thermometer, a reflux cooler, a Dean-Stark trap, a powder inlet, a nitrogen inlet device, a stirring device, 14.67 g (0.050 mol) of APB-N (1,3-bis-(3-aminophenoxy)benzene manufactured by Mitsui Chemical, Inc., molecular weight: 292.34) and 26.13 g (0.093 mol) of ABPS (3,3'-diamino-4,4'-dihydroxydiphenylsulfone manufactured by Nippon Kayaku Co., Ltd., molecular weight: 280.3) as diamine components were put, and 64.02 g of methylbenzoate as a solvent was added thereto while flowing dry nitrogen, followed by stirring at 60° C. for 30 minutes. After that, 45.38 g (0.146 mol) of ODPA (4,4'-oxydiphthalic acid anhydride manufactured by MANAC Incorporated, molecular weight: 310.22) as tetracarboxylic acid dianhydride component, 96.03 g of gamma-butyrolactone as a solvent, 1.465 g of gamma-valerolactone and 2.314 g of pyridine as catalysts, and 32.5 g of toluene as a dehydrating agent were further added thereto. The inside of the reactor was heated to 180° C. and the temperature was maintained for 6 hours while distilling off generated water through a Dean-Stark trap to carry out synthesis of polyamic acid and ring closure reaction (imidization reaction). After completion of the imidization reaction, the reaction liquid was cooled to 80° C. or less and then filtered under pressure using a Teflon (registered trademark) filter having a pore size of 3 μm. A 279 g solution (referred to as primer resin solution) was obtained where polyimide resin represented by the following formula (8):

in the above formula is aligned in an optional order) was dissolved in a mixed solvent of gamma-butyrolactone and methylbenzoate at a concentration of 34% by weight. Using an E-type rotational viscometer, 1.00 ml of this primer resin solution was measured at 25° C., resulting in that the rotational viscosity was 23.2 Pa·s. In 300 g of water, 50 g out of this primer resin solution was put. The precipitated resin was separated by filtration. For purification of said resin, the separated resin was added to 200 g of water and the mixture was refluxed. Then the resulting liquid was cooled to room temperature and then filtered, and the resulting resin was dried to obtain 16.5 g of resin powder (yield: 97.1%).

Synthesis Example 3

In a 500 ml reactor equipped with a thermometer, a reflux cooler, a Dean-Stark trap, a powder inlet, a nitrogen inlet device and a stirring device, 49.072 g (0.158 mol) of Kayabond C-300S (4,4'-diamino-3,3',5,5'-tetraethyldiphenylmethane manufactured by Nippon Kayaku Co., Ltd., molecular weight: 310.48) as diamine component was put, and 390.0 g of N-methyl-2-pyrrolidone as a solvent was added while flowing dry nitrogen, followed by stirring at 60° C. for 30 minutes. After that, 50.928 g (0.158 mol) of BTDA (3,4,3',4'-benzophenonetetracarboxylic acid dianhydride manufactured by Degussa, molecular weight: 322.23) as tetracarboxylic acid dianhydride component and 30.0 g of toluene as a dehydrating agent were further added thereto, the inside of the reactor was heated to 180° C., and the same temperature was maintained for 6 hours while distilling off generated water through a Dean-Stark trap to carry out synthesis of polyamic acid and ring closure reaction (imide reaction). After comple-

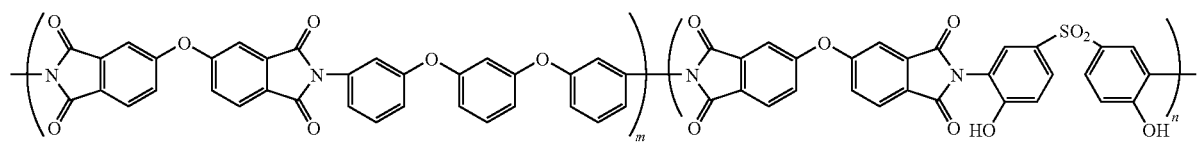

(8)

(wherein, each of m and n is a repeating number and m:n=35:65, the total weight average molecular weight is 87000, and each of the segments represented by the following formulas (8-m) and (8-n):

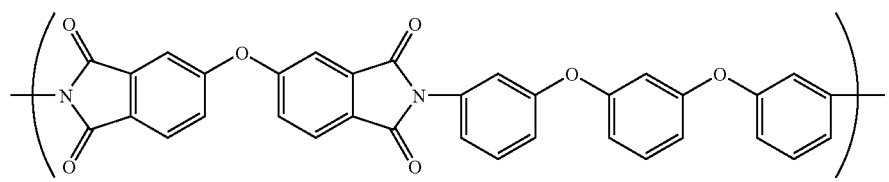

(8-m)

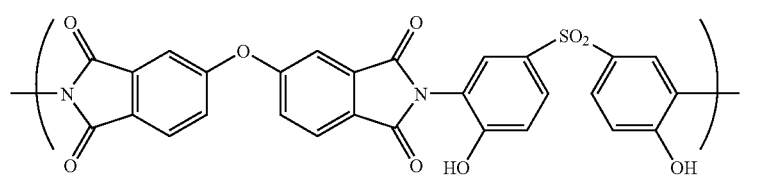

(8-n)

tion of the imidization reaction, the reaction liquid was cooled to 80° C. or less and then filtered under pressure using a Teflon (registered trademark) filter having a pore size of 3 μm. A 500 g solution (referred to as primer resin solution) was obtained where polyimide resin represented by the following formula (9):

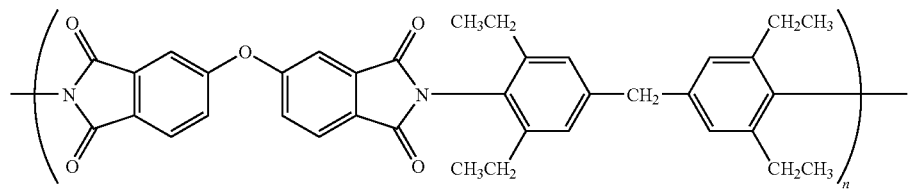

(wherein, n is a repeating number, and the total weight average molecular weight is 72000) was dissolved in N-methyl-2-pyrrolidone at a concentration of 20% by weight. Using an E-type rotational viscometer, 1.00 ml out of this primer resin solution was measured at 25° C., resulting in that the rotational viscosity was 870 mPa·s. Into 300 g of water, 50 g out of this primer resin solution was put, and the precipitated resin was separated by filtration. For purification of said resin, 200 g of water was added to the separated resin and the mixture was refluxed. Then, the resulting liquid was cooled to room temperature and then filtered, and the resulting resin was dried to obtain 9 g of resin powder (yield: 90.0%).

Example 1

Using a mixing roll, the components in the composition ratio shown in Table 1 described afterward were uniformly mixed to obtain a semiconductor sealing resin composition. This resin composition was grinded with a mixer and further tableted with a tablet machine.

In addition, aside from this, lead frames (1) (for adhesive evaluation) and (2) (for solder cracking resistance evaluation) which have a primer resin layer for semiconductor devices of the present invention were made as follows.

The lead frame (1) (for adhesive evaluation) with a primer resin layer:

Using an applicator, a copper lead frame shown in the FIG. 1 was coated with a primer resin (5% solution, solvent: N-methylpyrrolidone) obtained in Synthesis Example 1 so that the film thickness after drying is 1.2 μm. The coated film obtained was dried at 130° C.×60 minutes and then left to cool to room temperature to obtain a lead frame (1) (for adhesive evaluation) having a primer resin layer for semiconductor devices of the present invention with a thickness of 1.2 μm. In this regard, the three lead frames of FIG. 1 are integrated on the same plane as shown in FIG. 1.

Figure 3:
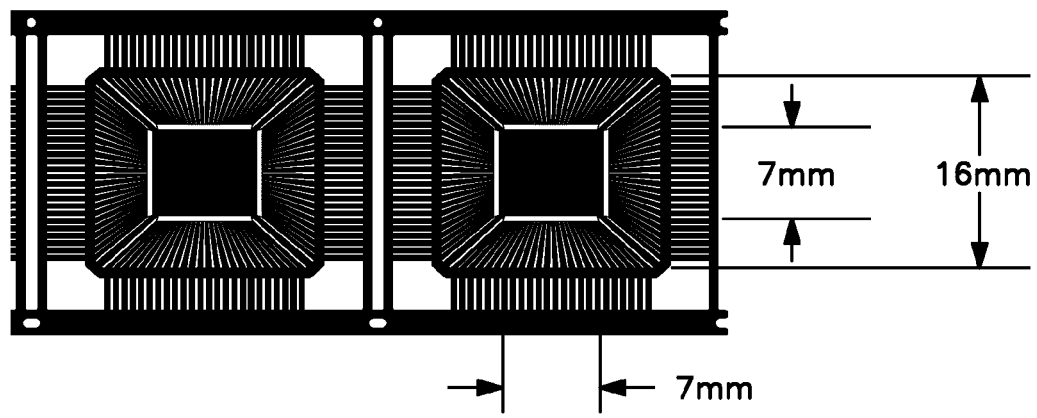
FIG. 3 shows a lead frame for evaluation of solder cracking resistance.

The lead frame (2) (for solder cracking resistance evaluation) with a primer resin layer:

96PinQFP (package size: 14×14× thickness of 1.35 mm, tipsize: 7×7× thickness of 0.4 mm) as a copper lead frame shown in FIG. 3 was treated in the same manner as in the case of the above lead frame (1) to make a lead frame (2) (for solder cracking resistance evaluation) having a primer resin layer for semiconductor devices of the present invention. In this regard, the two lead frames of FIG. 3 are integrated on the same plane as shown in FIG. 3.

Then, a simulated semiconductor device for evaluation test (which is a test piece for evaluation) was produced as follows.

Production of a simulated semiconductor device for evaluation test (a test piece for evaluation):

The lead frames (1) and (2) obtained in the above were respectively placed in a transfer molding machine and the above semiconductor sealing resin composition tableted was pressed into each and molded (at 175° C.×60 seconds). Next, post-curing was carried out under the conditions of 160° C.×2 hours+180° C.×6 hours.

Figure 2:
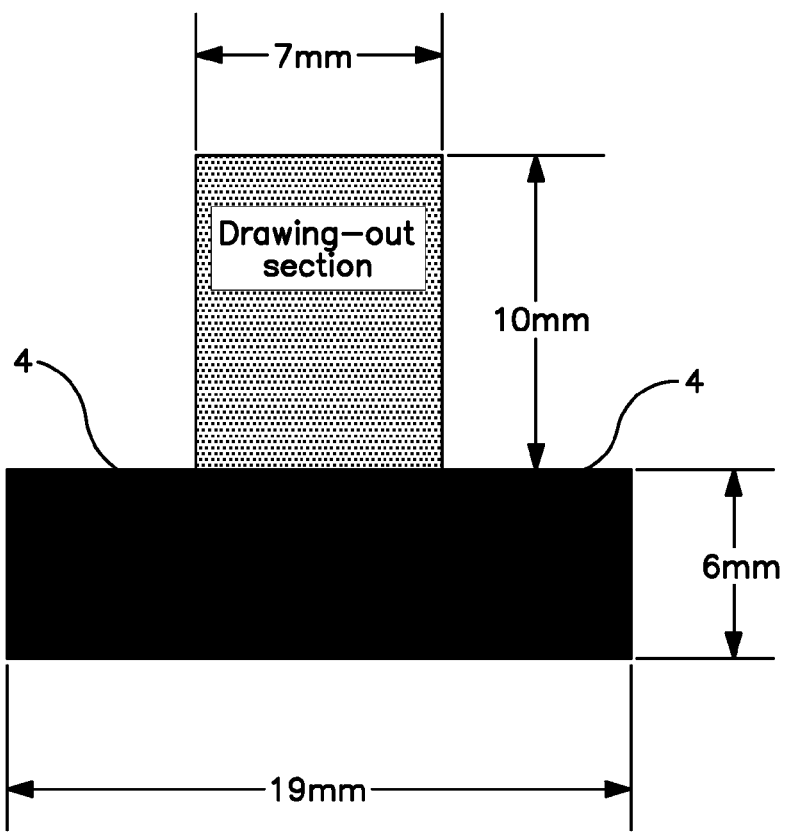
FIG. 2 shows a test piece for adhesive evaluation.
Figure 5:
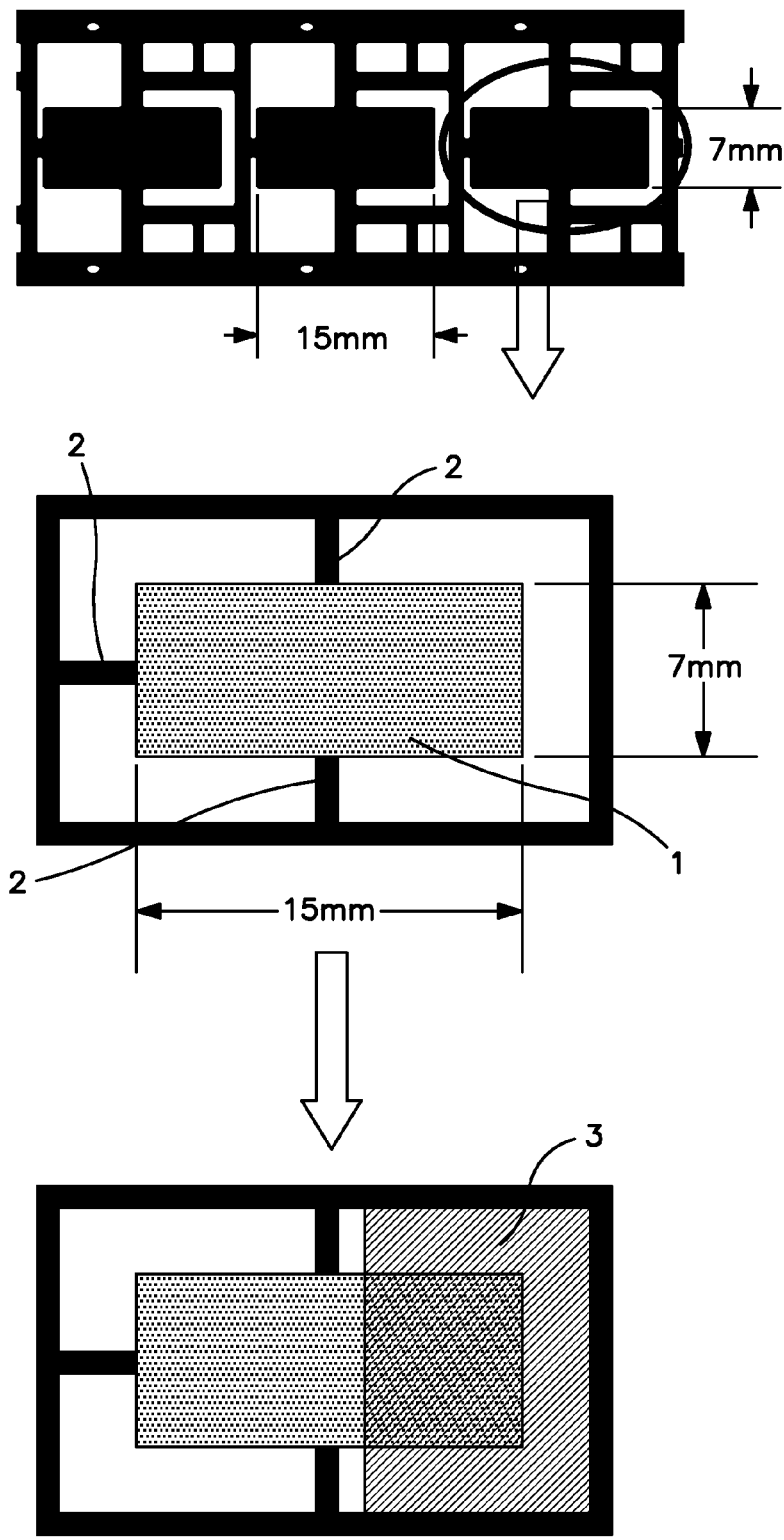
FIG. 5 shows a schematic diagram of a test piece production for adhesive evaluation.
Figure 6:
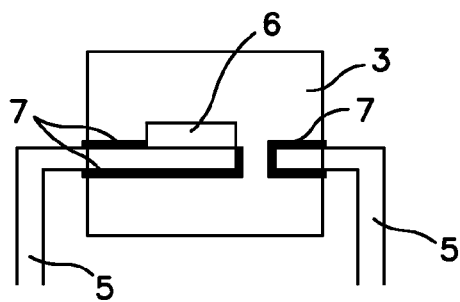
FIG. 6 shows a cross-sectional view of a semiconductor device comprising a resin layer comprising a primer resin between a cured product of a semiconductor sealing resin and a lead frame comprising copper or 42 alloy.
Figure 7:
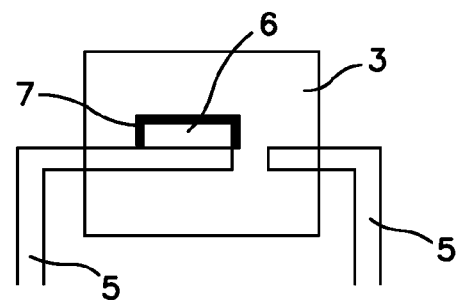
FIG. 7 shows a cross-sectional view of a semiconductor device comprising a resin layer comprising a primer resin between a cured product of a semiconductor sealing resin and a semiconductor.
Figure 8:
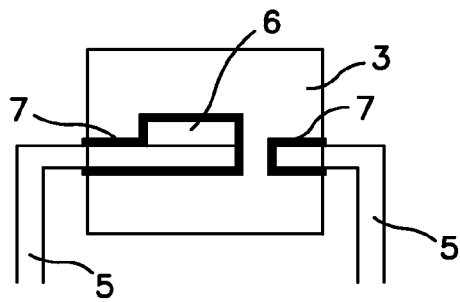
FIG. 8 shows a cross-sectional view of a semiconductor device comprising a resin layer comprising a primer resin between a cured product of a semiconductor sealing resin and both of a lead frame comprising cooper or 42 alloy and a semiconductor.

From the above lead frame (1), a simulated semiconductor device for adhesive evaluation (FIG. 2) was obtained. In addition, the mold of the simulated semiconductor device for adhesive evaluation was adjusted so that only some part (5 mm) of the lead frame is sealed by the semiconductor sealing resin composition 3 as shown in FIG. 5. Further, the three lead frames were respectively cut at the cut section 2 in FIG. 5 after curing to make a test piece for evaluation test for adhesive evaluation (simulated semiconductor device) (FIG. 2).

Figure 4:
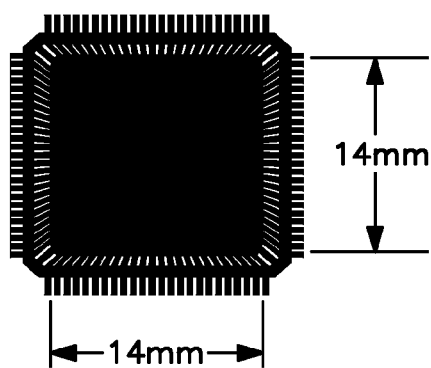
FIG. 4 shows a test piece for evaluation of solder cracking resistance.

On the other hand, from the lead frame (2), a test piece (simulated semiconductor device) for solder cracking resistance evaluation (FIG. 4) was obtained.

Evaluation of the test piece (simulated semiconductor device for evaluation test) was conducted in the following method and the results are shown in Table 1.

Adhesive Strength Test (Drawing Out Method)

The both ends of the sealed drawing-out section (locking section 4 in FIG. 2) in the resin sealing section of the obtained test piece for adhesive evaluation (FIG. 2) are fixed by a claw-shaped jig and the drawing-out section was drawn out by a universal tensile tester at a crosshead speed of 3 mm/min. In this regard, the bonded area at that time was 74.25 square millimeters.

Test of Solder Cracking Resistance

The obtained test piece for solder cracking resistance evaluation (FIG. 4) was left for 24 hours in a thermostatic set at a relative humidity of 85° C./85% RH to absorb moisture, and then solder reflow test was conducted at 260° C.×10 seconds. Package cracking caused by thermal shock at that time was evaluated by visual observation, and X is marked in the case that cracking was observed while O is marked in the case that cracking was not observed by both visual observation and an ultrasonic flaw detector.

Example 2

A test piece (simulated semiconductor device) was made in the same manner as in Example 1 except that the primer resin obtained in Synthesis Example 2 was used instead of the primer resin used in Example 1 which had been obtained in Synthesis Example 1. The evaluation of the test piece is shown in Table 1.

Example 3

A test piece (simulated semiconductor device) was made in the same manner as in Example 1 except that the primer resin obtained in Synthesis Example 3 was used instead of the primer resin used in Example 1 which had been obtained in Synthesis Example 1. The evaluation of the test piece is shown in Table 1.

Comparative Example 1

A test piece (simulated semiconductor device) was made in the same manner as in Example 1 except that the primer resin used in Example 1 was not used. The evaluation of the test piece is shown in Table 1.

Example 4

A test piece (simulated semiconductor device) was made in the same manner as in Example 1 except that a lead frame whose copper surface had been plated with palladium was used instead of the copper lead frame used in Example 1. The evaluation of the test piece is shown in Table 2.

Example 5

A test piece (simulated semiconductor device) was made in the same manner as in Example 1 except that the primer resin obtained in Synthesis Example 2 was used instead of the primer resin obtained in Example 1 and a lead frame whose copper surface had been plated with palladium was used instead of the copper lead frame used in Example 1. The evaluation of the test piece is shown in Table 2.

Comparative Example 2

A test piece (simulated semiconductor device) was made in the same manner as in Example 1 except that the primer resin used in Example 1 was not used and a lead frame whose copper surface had been plated with palladium was used instead of the copper lead frame used in Example 1. The evaluation of the test piece is shown in Table 2.

Example 6

A test piece (simulated semiconductor device) was made in the same manner as in Example 1 except that a lead frame whose copper surface had been plated with gold was used instead of the copper lead frame used in Example 1. The evaluation of the test piece is shown in Table 3.

Example 7

A test piece (simulated semiconductor device) was made in the same manner as in Example 1 except that the primer resin obtained in Synthesis Example 2 was used instead of the primer resin obtained Synthesis Example 1 which was used in Example 1 and a lead frame whose copper surface had been plated with gold was used instead of the copper lead frame used in Example 1. The evaluation of the test piece is shown in Table 3.

Comparative Example 3

A test piece (simulated semiconductor device) was made in the same manner as in Example 1 except that the primer resin used in Example 1 was not used and a lead frame whose copper surface had been plated with gold was used instead of the copper lead frame used in Example 1. The evaluation of the test piece is shown in Table 3.

TABLE 1

|  | Example 1 | Example 2 | Example 3 | Comparative Ex. 1 |
|---|---|---|---|---|
| EOCN-1020 | 12.5 | ← | ← | ← |
| PN | 6.6 | ← | ← | ← |
| TPP | 0.2 | ← | ← | ← |
| FB-74 | 56 | ← | ← | ← |
| ZA-30 | 24 | ← | ← | ← |
| Carnauba wax | 0.3 | ← | ← | ← |
| KBM-303 | 0.3 | ← | ← | ← |
| Lead frame | Cu | ← | ← | ← |
| Lead frame coating Primer resin | Synthesis Example 1 | Synthesis Example 2 | Synthesis Example 3 | None |
| Note * (g/mm$^2$) | 700.1 | 742.4 | 733.9 | 41.8 |
| Solder cracking resistance | ○ | ○ | ○ | X |

Note * Adhesive strength

TABLE 2

|  | Example 4 | Example 5 | Comparative Ex. 2 |
|---|---|---|---|
| EOCN-1020 | 12.5 | ← | ← |
| PN | 6.6 | ← | ← |
| TPP | 0.2 | ← | ← |
| FB-74 | 56 | ← | ← |
| ZA-30 | 24 | ← | ← |
| Carnauba wax | 0.3 | ← | ← |
| KBM-303 | 0.3 | ← | ← |
| Lead frame | Pd plated/Cu | ← | ← |
| Lead frame coating Primer resin | Synthesis Example 1 | Synthesis Example 2 | None |
| Note * (g/mm$^2$) | 417.0 | 477.4 | 138.8 |
| Solder cracking resistance | ○ | ○ | X |

Note * Adhesive strength

TABLE 3

|  | Example 6 | Example 7 | Comparative Ex. 3 |
|---|---|---|---|
| EOCN-1020 | 12.5 | ← | ← |
| PN | 6.6 | ← | ← |
| TPP | 0.2 | ← | ← |
| FB-74 | 56 | ← | ← |
| ZA-30 | 24 | ← | ← |
| Carnauba wax | 0.3 | ← | ← |
| KBM-303 | 0.3 | ← | ← |
| Lead frame | Au plated/Cu | ← | ← |
| Lead frame coating Primer resin | Synthesis Example 1 | Synthesis Example 2 | None |
| Note * (g/mm$^2$) | 387.7 | 452.0 | 29.4 |
| Solder cracking resistance | ○ | ○ | X |

Note * Adhesive strength

In this regard, the abbreviations in Tables 1 to 3 mean as follows. In addition, the numerical values in each composition in the tables are based on part(s) by weight.

EOCN-1020: o-cresol novolak-type epoxy resin (manufactured by Nippon Kayaku Co., Ltd., epoxy equivalent: 195 g/eq, softening point: 55° C.)

PN: phenol novolak resins (manufactured by Nippon Kayaku Co., Ltd., hydroxy group equivalent: 103 g/eq)

TPP: triphenyl phosphine (manufactured by Junsei Chemical Co., Ltd.)

FB-74: sphericall silica (manufactured by ADEKA Corporation)

ZA-30: crushed silica (manufactured by Tatsumori Ltd.)

Carnauba wax: fine-powdered carnauba (manufactured by Toakasei Co., Ltd.)

KBM-303: silane coupling agent (manufactured by Shin-Etsu Chemical Co., Ltd.)

As described above, the primer resin for semiconductor devices of the present invention has the effect of improving adhesive strength between a cured product of a semiconductor sealing resin composition and a lead frame or a semiconductor element, together with the effect of improving heat resistance.

The invention claimed is:

1. A semiconductor device comprising a resin layer comprising a primer resin between a cured product of a semiconductor sealing resin composition and either or both of a lead frame comprising copper or 42 alloy and a semiconductor element, wherein said primer resin has a ring-closed polyimide structure represented by the following formula (1):

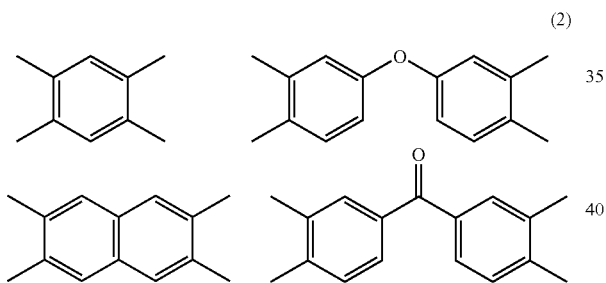
(1)

wherein, n is a repeating number and represents a positive number of 10 to 1000, $R_1$ represents at least one kind of quadrivalent aromatic group selected from the group consisting of the following formula (2):

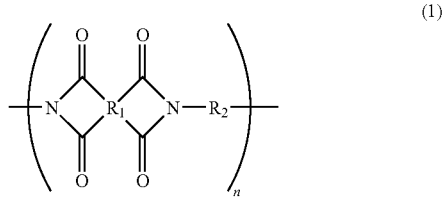
(2)

and $R_2$ represents at least one kind of divalent aromatic group selected from the group consisting of the following formula (3):

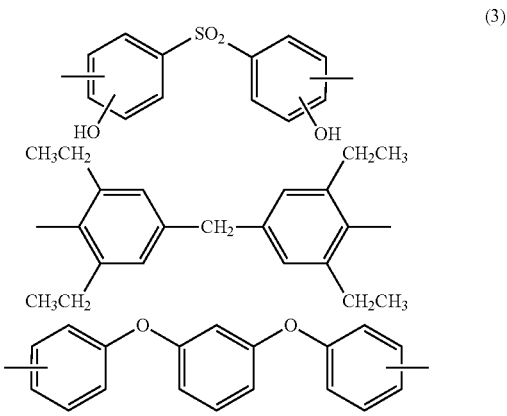
(3)

respectively.

2. The semiconductor device according to claim 1, wherein $R_1$ is at least either one of the groups depicted by the following formula (2-1):

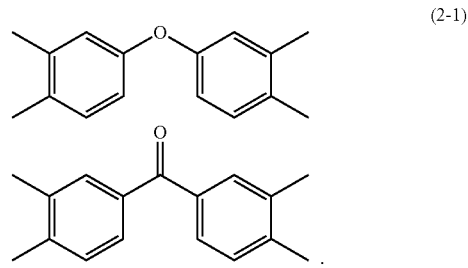
(2-1)

3. The semiconductor device according to claim 1, wherein the ring-closed polyimide structure is a ring-closed polyimide structure represented by any one of the following formulas (7') to (9'):

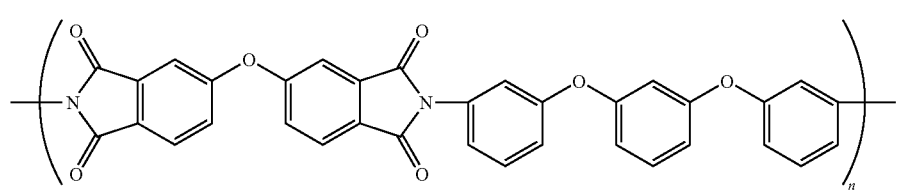
(7')

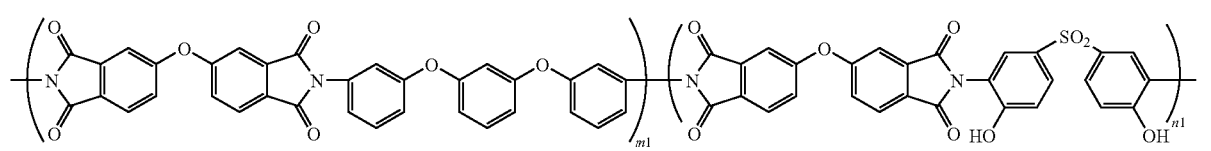
(8')

-continued

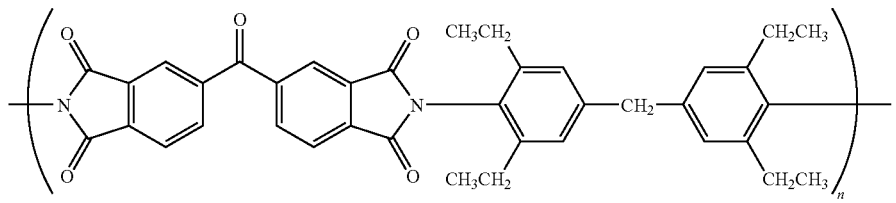
(9')

wherein, n represents a positive number of 10 to 1000 and each of n1 and m1 represents a positive number of 1 to 1000, provided that n1+m1 is a positive number of 10 to 1000.

4. An semiconductor sealing epoxy resin composition comprising a primer resin (A) is between a cured product of a semiconductor sealing resin composition and either or both of a lead frame comprising copper or 42 alloy and a semiconductor element, and, an epoxy resin (B), a curing agent (C) and an inorganic filler (D), wherein the primer resin (A) has a ring-closed polyimide structure represented by the following formula (1):

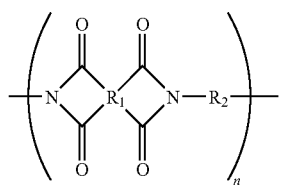
(1)

wherein, n is a repeating number and represents a positive number of 10 to 1000, $R_1$ represents at least one kind of quadrivalent aromatic group selected from the group consisting of the following formula (2):

(2)

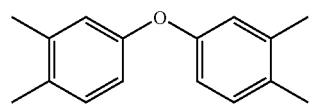
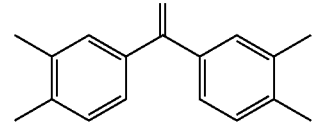

and $R_2$ represents at least one kind of divalent aromatic group selected from the group consisting of the following formula (3):

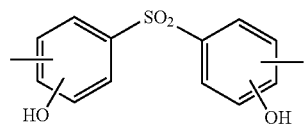
(3)

-continued

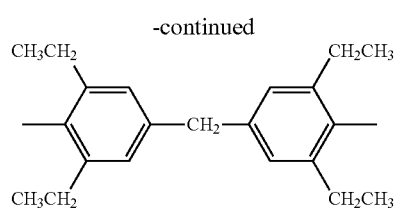

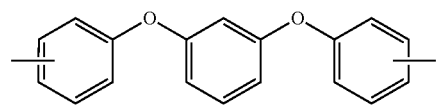

respectively.

5. The semiconductor sealing epoxy resin composition according to claim 4, wherein $R_1$ is at least either one of the groups of the following formula (2-1)

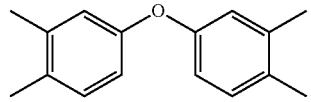
(2-1)

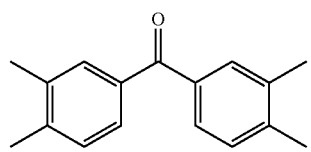
.

6. A method for producing a semiconductor device characterized by applying a primer resin having a ring-closed polyimide structure represented by the following formula (1):

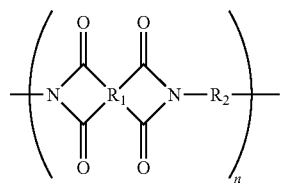
(1)

wherein, n is a repeating number and represents a positive number of 10 to 1000, $R_1$ represents at least one kind of quadrivalent aromatic group selected from the group consisting of the following formula (2):

(2)

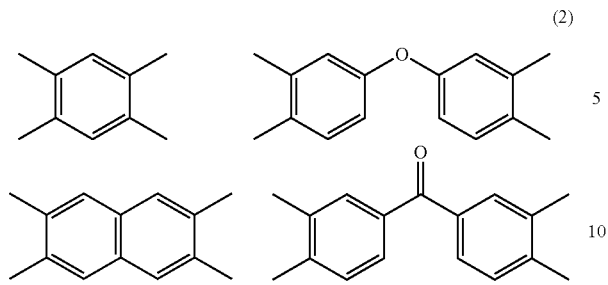

and
R₂ represents at least one kind of divalent aromatic group selected from the group consisting of the following formula (3):

(3)

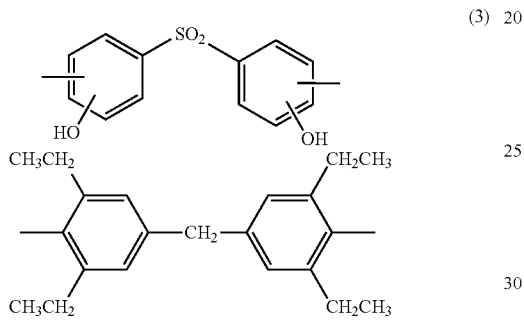

respectively on a lead frame provided with a semiconductor element to form said primer resin layer and then by sealing the semiconductor element with a cured product of a semiconductor sealing resin composition.

7. The method for producing a semiconductor device according to claim 6, wherein $R_1$ is at least either one of the groups of the following formula (2-1)

(2-1)

8. The method for producing a semiconductor device according to claim 6, the ring-closed polyimide structure is at least either one of the groups of the following formulas (7') to (9')

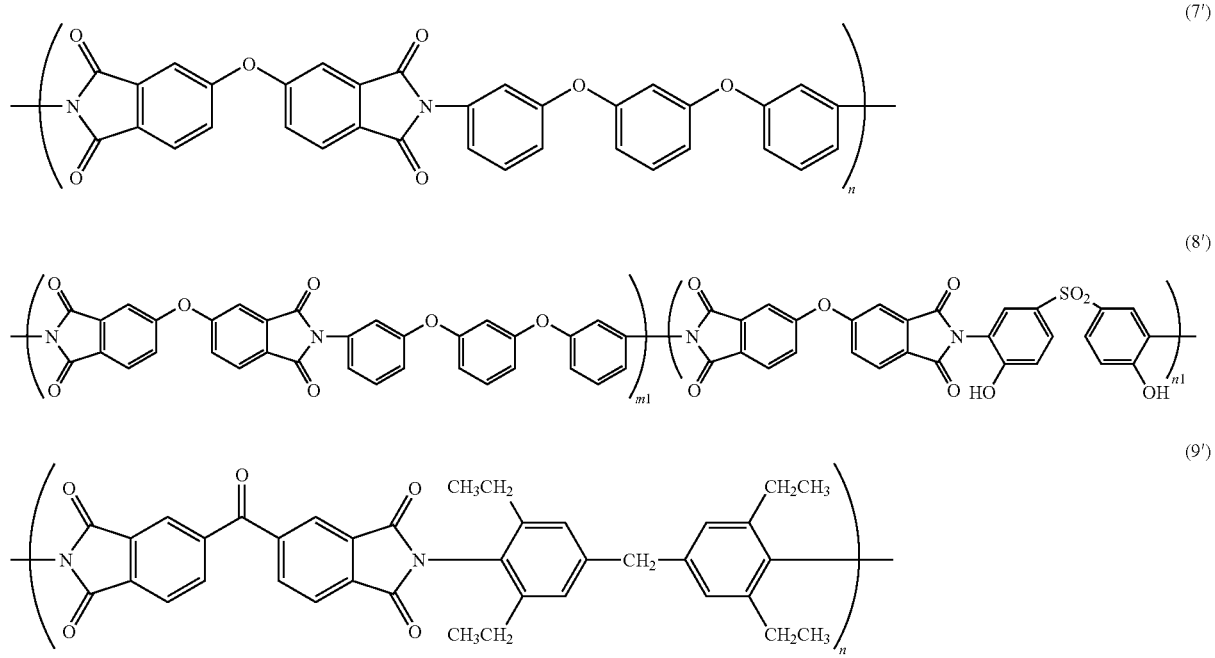

wherein, n represents a positive number of 10 to 1000 and each of n1 and m1 represents a positive number of 1 to 1000, provided that n1+m1 is a positive number of 10 to 1000.

* * * * *